United States Patent
Brofman et al.

[19]

[11] Patent Number: 5,975,409
[45] Date of Patent: Nov. 2, 1999

[54] CERAMIC BALL GRID ARRAY USING IN-SITU SOLDER STRETCH

[75] Inventors: Peter J. Brofman, Hopewell Junction; Patrick A. Coico, Fishkill; Mark G. Courtney, Poughkeepsie; Shaji Farooq, Hopewell Junction; Lewis S. Goldmann, Bedford; Raymond A. Jackson; David C. Linnell, both of Poughkeepsie; Gregory B. Martin, Wappingers Falls; Frank L. Pompeo, Montgomery; Kathleen A. Stalter, Hopewell Junction; Hilton T. Toy, Wappingers Falls, all of N.Y.

[73] Assignee: International Business Machines Corporation, Armonk, N.Y.

[21] Appl. No.: 08/909,865

[22] Filed: Aug. 12, 1997

[51] Int. Cl.[6] .............................. B23K 31/02; B23K 37/04
[52] U.S. Cl. ..................... 228/180.22; 228/6.2; 228/19; 228/49.5
[58] Field of Search .............................. 228/180.22, 6.2, 228/19, 49.5, 44.7

[56] References Cited

U.S. PATENT DOCUMENTS

| | | | |
|---|---|---|---|
| 5,148,968 | 9/1992 | Schmidt et al. ........................... | 228/19 |
| 5,341,979 | 8/1994 | Gupta ................................. | 228/180.22 |
| 5,441,195 | 8/1995 | Tustaniwskyj et al. ........... | 228/180.22 |
| 5,482,200 | 1/1996 | Myers et al. ............................ | 228/191 |
| 5,573,172 | 11/1996 | Gore ................................. | 228/180.22 |

OTHER PUBLICATIONS

*Microelectronics Packaging Handbook*, Tummala et al., (1989) pp. 366–391.

*Primary Examiner*—Patrick Ryan
*Assistant Examiner*—Jeffrey T. Knapp
*Attorney, Agent, or Firm*—DeLio & Peterson, LLC; John J. Tomaszewski; Aziz M. Ahsan

[57] ABSTRACT

A method and apparatus is provided for forming an elongated solder joint between two soldered substrates of an electronic module by applying a controlled separating force between the two soldered substrates during and/or after heating of the module. The solder joints are plasticized, preferably to the molten state above the liquidus temperature, and are thereby stretched and the module is then cooled to solidify the stretched joints. An apparatus and method are provided which preferably uses a vacuum device as the separating force to stretch the existing solder joints to the desired solder height and configuration which is preferably an hour-glass shape.

5 Claims, 2 Drawing Sheets

CERAMIC BALL GRID ARRAY USING IN-SITU SOLDER STRETCH

BACKGROUND OF THE INVENTION

1. Field of the Invention

This invention relates generally to electrically and mechanically interconnecting one electronic component to another electronic component to form an electronic assembly or module and, in particular, to stretching or otherwise elongating the solder joints of an existing module to form elongated solder joints having enhanced mechanical and electrical integrity and reliability.

2. Description of Related Art

Forming an electronic package assembly whereby an electrical component such as an integrated circuit chip is electrically connected to a substrate such as a card, or board, another chip or another electronic part is well-known in the art. Surface mount technology (SMT) has gained acceptance as the preferred means of joining electronic package assemblies. The following description for convenience will be directed to joining ceramic electronic components such as multilayer ceramic components as exemplified by integrated circuit chips to printed circuit cards or boards.

Multilayer ceramic electronic components are typically joined together by solder balls on a surface of one of the electronic components to corresponding pads on the surface of the other component. Control Collapse Chip Connection is an interconnect technology developed by IBM as an alternative to wire bonding. This technology is generally known as C4 technology or flip chip packaging. Broadly stated, one or more integrated circuit chips are mounted above a single or multiple layer ceramic substrate or board pads on the chip are electrically or mechanically connected to corresponding pads on the other substrate by a plurality of electrical connections such as solder bumps. The integrated circuit chips may be assembled in an array such a 10×10 array.

In the C4 interconnect technology, a relatively small solder bump is attached to pads on one of the components being joined. The electrical and mechanical interconnects are then formed by positioning the corresponding pads on the other electronic component adjacent the solder bumps and reflowing the bumps as elevated temperature. The C4 joining process is self-aligning in that the wetting action of the solder will align the chip bump pattern to the corresponding substrate pads.

A myriad of solder structures have been proposed for the surface mounting of one electronic structure to another. Typical surface mount processes form the solder structures by screening solder paste on conductive, generally metallic pads exposed on the surface of the first electronic structure or substrate. A stencil printing operation is used to align the contact mask to the pads. The solder paste is reflowed in a hydrogen atmosphere and homogenizes the pad and brings the solder into a spherical shape. The solder spheres on the substrate are then aligned to corresponding pads on the electronic structure or board to be connected thereto. After alignment, the substrate and board go through a reflow operation to melt the solder and create a solder bond between the corresponding pads on the substrate and other electronic component. The interconnection is typically in a form of a double truncated sphere as shown in FIG. 3.

Other known surface mount technology uses solder balls rather than solder paste to provide the solder connecting structures. By using solder balls, a more exact and somewhat greater quantity of solder can be applied than from screening. The solder balls are aligned and are held to a substrate and melted to form a solder joint on a conductive pad of the substrate. As before, the substrate with the newly joined solder balls is aligned to the board to be connected therewith and the solder balls are then reflowed to form a solder bond between the two substrates. The use of a copper ball surrounded by eutectic solder is also used as a solder joint structure for attaching a multilayer ceramic (MLC) substrate to a PC laminate wherein the ball serves as a standoff.

C4 joint technology, commonly referred to as ceramic ball grid array technology (CBGA), offers advantages of low cost, and a low inductance surface mounting interconnection. However, a thermal expansion mismatch between the chip and substrate will cause a shear displacement to be applied on each solder connection. Over the lifetime of a module, this leads to an accumulated plastic deformation and decreases the lifetime of the module. The typical solder joint having the shape of a doubly truncated sphere which is truncated at each pad is known to have a limited lifetime due to the thermal mismatch between the substrates and the shape of the bump. It is known that changes in shape away from a spherical segment can produce enhanced mechanical properties and testing has shown an order of magnitude difference in fatigue life between an hour-glass shape and a barrel-shape (double truncated spherical) joint. The fracture location of the hour-glass joint shifted to the center of the joint instead of at the pad-joint interface.

Stretched solder joints have been fabricated by a number of techniques including using different solders on the same chip. Solder columns have also been stacked to achieve improved fatigue life. Two solder alloys have been used in combination wherein the surface tension of a larger bump is used to raise and stretch the smaller area of the joints. Another approach involves stacking C4 bumps using polyimide interposer, but this technique adds considerable cost and manufacturing complexity without improved benefit.

A centrifugal force technique has also been employed wherein modules having C4 solder joints are heated and spun such that the C4s are elongated. This technique has obvious manufacturing difficulties when using large printed circuit cards. Brackets attached to one of the substrates has also been used to stretch the C4 joints. Basically, the bracket, when activated by heat or other means, raises one of the substrates in the z-axis stretching the C4 connection. The bracket, however, becomes an integral part of the final structure requiring the packaging design to incorporate the bracket and related fixturing.

Bearing in mind the problems and deficiencies of the prior art, it is therefore an object of the present invention to provide a method of forming an elongated solder joint between two solder interconnected substrates in an electronic module to enhance the mechanical and electrical integrity and reliability of the module.

It is another object of the present invention to provide an apparatus for forming an elongated solder joint between two solder interconnected substrates of an electronic module to enhance the mechanical and electrical integrity and reliability of the module.

A further object of the invention is to provide electronic modules having solder joints having enhanced mechanical and electrical integrity and reliability.

It is yet another object of the present invention to provide an electronic component assembly or module made using the method and apparatus of the invention.

Other objects and advantages of the invention will be readily apparent from the description.

SUMMARY OF THE INVENTION

The above and other objects, which will be apparent to those skilled in the art, are achieved in the present invention which is directed in a first aspect to a method of forming an elongated solder joint between two solder interconnected substrates in an electronic module comprising the steps of applying a controlled separating force to heated plasticized solder joints of the two electrical substrates, stretching the plasticized solder joints and then cooling the module to solidify the stretched solder joints. The plasticized joints are heated to near, and preferably above, the liquidus temperature of the solder, and in the latter instance are molten during stretching.

In another aspect of the invention, a method of forming an elongated solder joint between two solder substrates in an electronic module is provided comprising the steps of:

forming solder joints, typically spherical, between two electronic substrates forming an interconnected electronic module;

heating the module to plasticize the solder joints;

applying a separating force to the two electronic substrates whereby the plasticized solder joints are stretched by the separating force to form an elongated solder joint; and cooling the stretched module forming the completed electronic module having elongated solder joints.

In a further aspect of the invention, an apparatus is provided for forming an elongated solder joint between two solder interconnected substrates in an electronic module comprising:

a first substrate and a second substrate joined together by a plurality of solder joints, typically spherical in shape;

separating means communicating with the first substrate to apply a separating force between the first substrate and the second substrate;

restricting means to hold the second substrate in a fixed position relative to the first substrate;

stopping means to restrict the z-axis or vertical movement (separation) of the first substrate relative to the second substrate;

heating means to plasticize the solder joints so that the separating means stretches the solder joints until the stopping means restricts the upward movement of the first substrate forming the stretched solder joints; and cooling means to solidify the stretched solder joints forming the electronic module having elongated solder joints.

In an additional aspect of the invention, an electronic component assembly or module is made using the method and/or apparatus of the invention as described hereinabove. The electronic component module of the invention will typically have hour-glass shaped solder joints between the two substrates which joints are formed by the stretching action of the separating means used to separate the solder interconnected substrates during the method of the invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
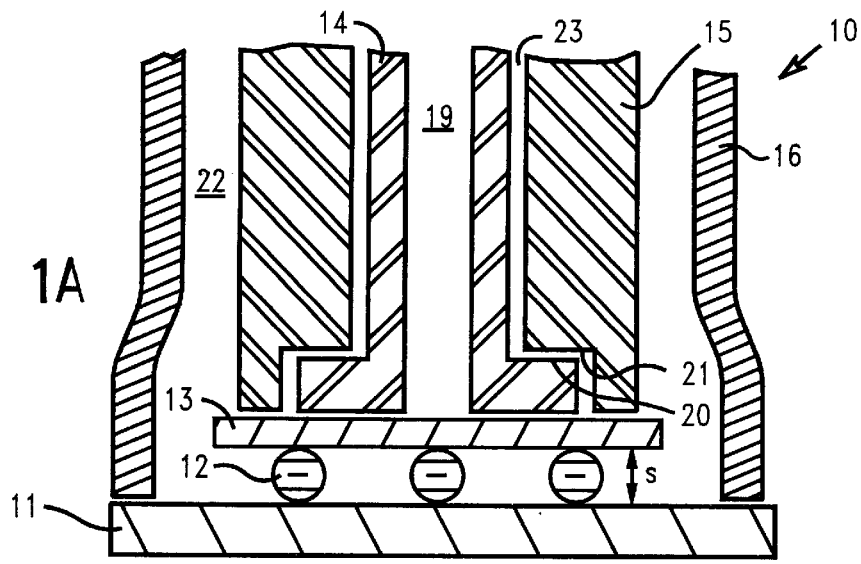
FIGS. 1A–1C show cross-sectional views of an apparatus of the present invention during different stages of the solder joint stretching process.

In describing the preferred embodiment of the present invention, reference will be made herein to FIGS. 1–3 of the drawings in which like numerals refer to like features of the invention. Features of the invention are not necessarily shown to scale in the drawings.

Figure 2:
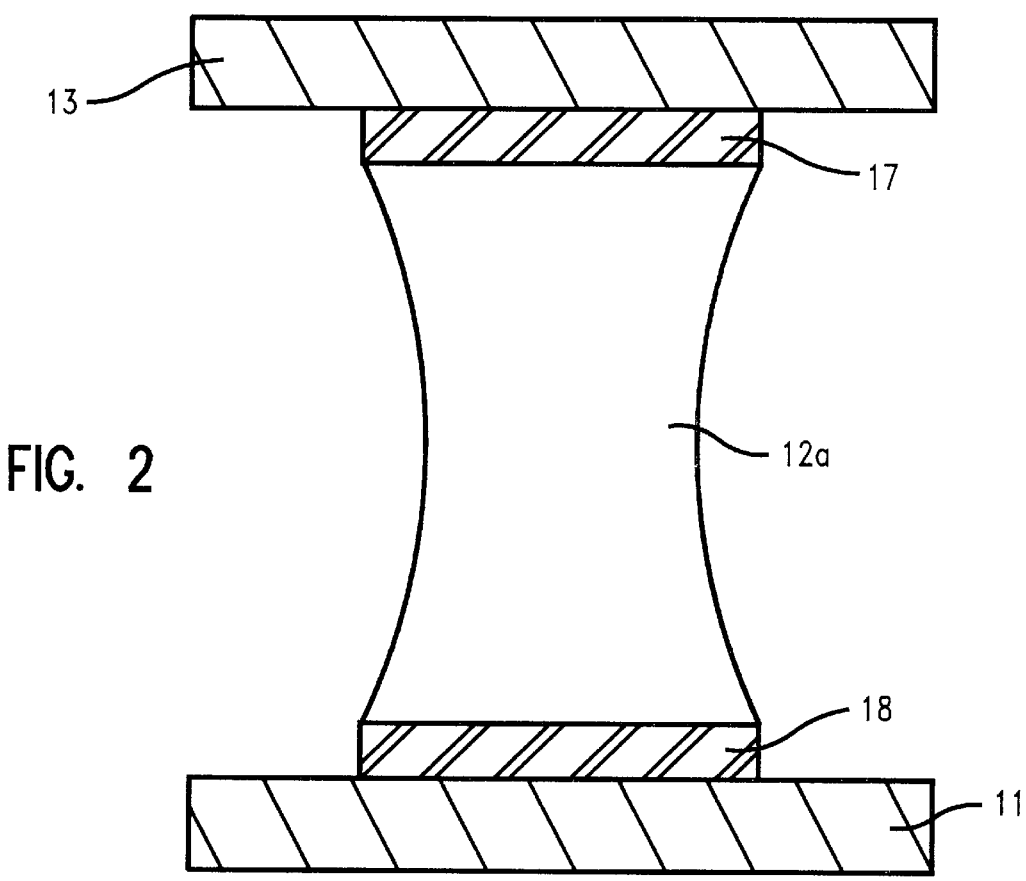
FIG. 2 shows a cross-sectional view of a stretched solder joint made using the apparatus of FIG. 1.
Figure 3:
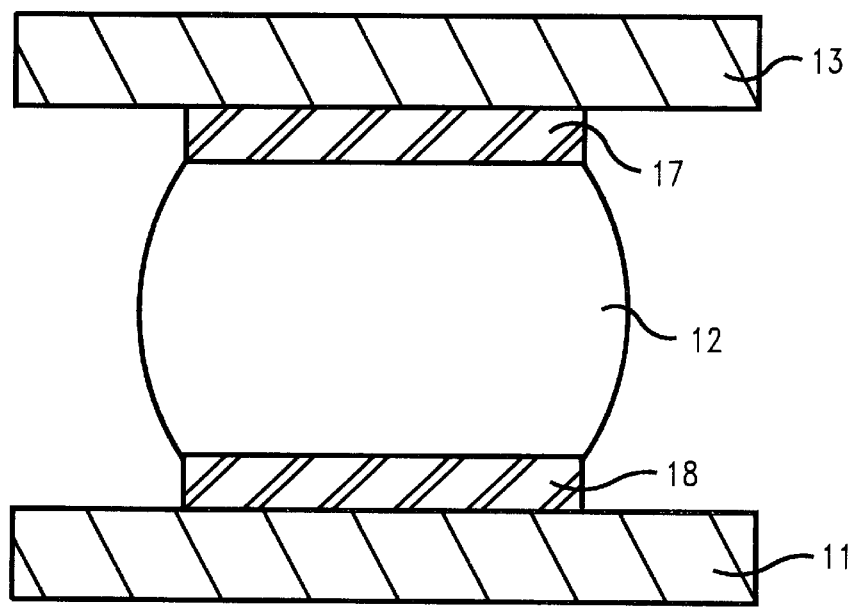
FIG. 3 shows a cross-sectional view of a double truncated spherical solder joint of the prior art.

Referring first to FIGS. 2 and 3, FIG. 3 shows a typical double truncated spherical solder joint 12 between two electronic substrates. In FIG. 3, a substrate 13 which will typically be a chip is shown having a pad 17. The double truncated spherical solder joint 12 is shown connecting pad 17 to pad 18 of substrate 11 which may be a printed circuit board. With the prior art solder joint 12 shown in FIG. 3, stresses at the intersection of the solder joints with the pads is where failure typically occurs reducing the reliability and integrity of the module.

FIG. 2 shows a cross-sectional view of a preferred solder joint made by the method and apparatus of the invention. Accordingly, chip 13 having pad 17 is shown interconnected by solder joint 12a to pad 18 of substrate 11. The solder joint 12a has an hour-glass figure which is more elongated and has a higher fatigue resistance than the double truncated spherical solder joint 12 shown in FIG. 3.

The solder used to join the substrates may be any suitable solder used in the prior art. Typically, the solder is a lead-tin solder and is preferably a lead-tin eutectic alloy solder such as 37 percent Pb and 63 percent Sn (by weight). The solder preferably has a single composition (is not a mixture of solders) and has a single melting point range. Although various sizes and geometries of the solder joint can be achieved with the method and apparatus of the invention, the hour-glass solder joint configuration of FIG. 2 is preferred. In an exemplary embodiment, a double truncated spherical solder joint 12 of FIG. 3 having about a 35 mil sphere diameter measured along an axis parallel to the pad surfaces is stretched, as shown in FIG. 2, to a solder joint height of about 50 mils with a width at the mid-span of the joint of about 20 mils. The stretched solder joint of FIG. 2 has a much higher fatigue resistance and greater reliability and integrity than the double truncated spherical joint of FIG. 3.

Figure 1B:
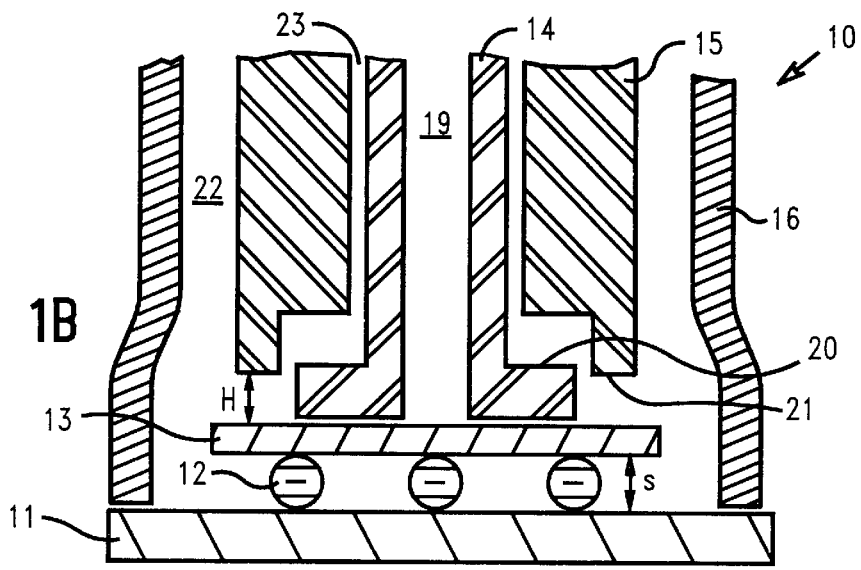
Figure 1C:
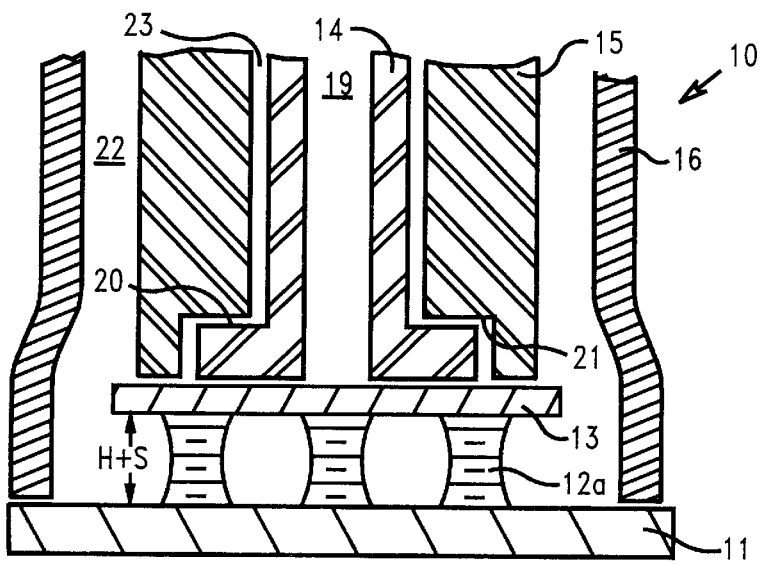

Referring to FIGS. 1A, 1B and 1C, a preferred method and apparatus of the invention is shown. Referring to FIG. 1A, an apparatus shown generally as 10 is used to process substrate 11, such as, a printed circuit board connected to substrate 13 which is typically a chip by solder joints 12 having a height S. The solder joints 12 will typically be double truncated spherical solder joints shown in FIG. 3. The pads are not shown in the figure for clarity.

A vacuum tube 14 is disposed at one end on the surface of chip 13. The other end of the vacuum tube 14 is connected to a vacuum source for exerting a vacuum in the tube and on the surface of chip 13. The vacuum tube has a bore 19 extending therethrough for this purpose. The end of vacuum tube 14 abutting the surface of chip 13 preferably has an outwardly extending shoulder 20 which is used to restrict vertical movement of the vacuum tube 14 during reflow and stretching of solder joint 12.

The vacuum tube 14 is inserted in bore 23 of lift stop device 15. The lift stop device 15 has an inwardly extending shoulder 21 which communicates with shoulder 20 to restrict upward movement of vacuum probe 14 during stretching of the solder joint 12. Other separating (lifting) means may be employed such as a gearing or other mechanism. Vacuum is preferred.

A hot gas shroud 16 is shown enclosing the chip 13, and solder joints 12 and substrate 11. Heat supplied in the opening 22 of heat shroud 16 heats the chip and substrate and softens or plasticizes the solder joints 12. As used herein, the term "plasticize" encompasses heating above or below the liquidus temperature of the joint, although it is preferred that the joint is molten during stretching. Any suitable heating means may be employed such as a stream of hot air impinging on chip 13 and substrate 11 or use of infrared heating.

In operation, the electronic module comprising substrate 11 and chip 13 interconnected by solder joint 12 is placed in position in heat shroud 16 for the reflow stretching operation procedure of the invention. The vacuum tube 14 and lift stop tube 15 are both lowered until the ends thereof are disposed on the surface of chip 13 as shown in FIG. 1A. The lift stop 15 is retracted (raised) the desired distance H as shown in FIG. 1B which distance H is the height that the solder joint 12 is desired to be stretched or lengthened. Hot gas is then introduced into opening 22 of shroud 16 at a temperature sufficient to plasticize solder joints 12. The vacuum is actuated and as shown in FIG. 1C, and when the solder joint 12 is sufficiently plasticized, the vacuum will cause vacuum probe 14 to rise raising chip 13 and stretching solder joint 12. The vacuum may be continually on before heating of the module as will be appreciated by those skilled in the art. The chip 13 will rise a distance H until shoulder 20 of vacuum tube 14 is restricted from further upward movement by mating shoulder 21 of lift stop 15. When the joints 12 have been stretched the desired distance H shown as solder joints 12a, the heat is removed and the assembly cooled solidifying the solder joints 12a in an hour-glass configuration as shown in FIG. 1C and FIG. 2. The height of the stretched solder joint will be H+S.

As discussed above, the solder joints 12 of the electronic module to be modified may be of any configuration and size typically used in fabrication of electronic components. Typically, the solder joints 12 are double truncated spherical solder joints having a diameter of about 20 to 30 mils with a pitch of 40 to 50 mils. The stretched solder joints will typically have a height of about 50 to 60 mils and preferably have an hour-glass configuration as shown in FIG. 2.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for forming an elongated solder joint between interconnected first and second substrates in an electronic module comprising:

a shroud;

a vertically moveable lift stop device within the shroud having a bore and an inwardly extending shoulder;

a vertically moveable vacuum tube extending through the bore the lower end of the tube proximate the lower end of the lift stop device and the other end connected to a vacuum source, the vacuum tube having an outwardly extending shoulder at the lower end proximate the lower end of the lift stop device;

heating means to plasticize the solder joints; and cooling means to solidify the solder joints after they are stretched and forming the electronic module having elongated solder joints, wherein the shroud is placed on the surface of the second substrate and encloses the first substrate therein, the vertically moveable lift stop device is moved vertically above the surface of the first substrate the desired elongated solder height, the lower end of the vacuum tube is resting on the surface of the first substrate and when a vacuum is applied to the vacuum tube, the vacuum tube holds the first substrate and moves upward through the bore until the outwardly extending shoulder of the vacuum tube meets the inwardly extending shoulder of the lift stop device so that the plasticized solder joints are stretched to the desired elongated solder joint height.

2. A method of forming an elongated solder joint between two substrates in an electronic module comprising the steps of:

forming solder joints between first and second electronic substrates forming an interconnected electronic module;

positioning a separating means on the surface of the second substrate to apply a separating force between the first substrate and second substrate, the separating means comprising:

a shroud resting on the surface of the second substrate and enclosing the first substrate therein;

a vertically moveable lift stop device within the shroud having a bore and an inwardly extending shoulder at its lower end the lower end proximate the surface of the second substrate; and a vertically moveable vacuum tube extending through the bore the lower end of the tube proximate the lower end of the lift stop device and the other end connected to a vacuum source, the tube having an outwardly extending shoulder at the end proximate the lower end of the lift stop device.

elevating the lift stop device above the first substrate to the desired elongated solder joint height;

heating the module to plasticize the solder joints;

applying a vacuum to the vacuum tube whereby the lower end of the vacuum tube holds the first substrate thereto and the tube moves upward through the bore until the outwardly extending shoulder of the vacuum tube meets and stops the inwardly extending shoulder of the lift stop device so that the plasticized solder joints are stretched to form an elongated solder joint; and cooling the stretched module forming the completed electronic module having elongated solder joints.

3. The method of claim 2 wherein the solder joints are plasticized by heating to above the liquidus temperature of the solder.

4. A method of forming an elongated solder joint between solder interconnected first and second substrates in an electronic module comprising the steps of:

positioning a separating means on the surface of the second substrate to apply a separating force between the first substrate and second substrate, the separating means comprising:
 a shroud resting on the surface of the second substrate and enclosing the first substrate therein;
 a vertically moveable lift stop device within the shroud having a bore and an inwardly extending shoulder at its lower end the lower end proximate the surface of the second substrate; and
 a vertically moveable vacuum tube extending through the bore the lower end of the tube proximate the lower end of the lift stop device and the other end connected to a vacuum source, the tube having an outwardly extending shoulder at the end proximate the lower end of the lift stop device;
elevating the lift stop device above the first substrate to the desired elongated solder joint height;

heating the module to plasticize the solder joints;

applying a vacuum to the vacuum tube whereby the lower end of the vacuum tube holds the first substrate thereto and the tube moves upward through the bore until the outwardly extending shoulder meets and stops the inwardly extending shoulder of the lift stop device so that the plasticized solder joints are stretched to form an elongated solder joint; and cooling the stretched module forming the completed electronic module having elongated solder joints.

5. The method of claim 4 wherein the solder joints are heated to above the liquidus temperature of the solder.

* * * * *